United States Patent
Matsushima

(10) Patent No.: US 6,921,782 B2
(45) Date of Patent: Jul. 26, 2005

(54) ADHESIVE AND ELECTRIC DEVICE

(75) Inventor: Takayuki Matsushima, Kanuma (JP)

(73) Assignee: Sony Chemicals Corp., Tokyo (JP)

( * ) Notice: Subject to any disclaimer, the term of this patent is extended or adjusted under 35 U.S.C. 154(b) by 57 days.

(21) Appl. No.: 10/053,956

(22) Filed: Jan. 24, 2002

(65) Prior Publication Data
US 2002/0151627 A1 Oct. 17, 2002

(30) Foreign Application Priority Data
Jan. 24, 2001 (JP) .......................... 2001-015448

(51) Int. Cl.$^7$ .............................................. C08L 63/00
(52) U.S. Cl. ...................... 523/457; 525/474; 525/475; 525/476; 525/523; 156/330
(58) Field of Search ................. 428/413, 414, 428/415, 416, 417, 418, 429, 447, 448; 523/400, 440, 442, 457; 525/107, 403, 474, 475, 476, 523; 156/325, 330

(56) References Cited

U.S. PATENT DOCUMENTS

| 5,492,968 | A | * | 2/1996 | Nakai et al. ................ 525/101 |
| 5,855,821 | A | | 1/1999 | Chau et al. .................. 252/514 |
| 6,022,911 | A | | 2/2000 | Hashizume et al. ......... 523/213 |
| 6,274,671 | B1 | * | 8/2001 | Kageishi et al. ............. 525/101 |
| 6,361,879 | B1 | * | 3/2002 | Tsutsumi et al. ............ 428/620 |
| 6,437,090 | B1 | * | 8/2002 | Murai et al. ................. 528/416 |
| 6,555,602 | B1 | * | 4/2003 | Harada et al. ............... 523/466 |

FOREIGN PATENT DOCUMENTS

| JP | 11-335641 | 12/1999 |
| JP | 2000-086987 | 3/2000 |
| WO | WO 99/54417 | 10/1999 |

* cited by examiner

Primary Examiner—Michael J. Feely
(74) Attorney, Agent, or Firm—Oliff & Berridge, PLC

(57) ABSTRACT

A novel adhesive cures quickly at a lower temperature and ensures reliable connection of objects the adhesive connects with each other. The adhesive includes a metal chelate, a silane coupling agent and a thermosetting resin. The silane coupling agent in the adhesive is hydrolyzed at its alkoxy groups to form silanol groups, which in turn react with the metal chelate to produce cations in the adhesive. The resulting cations cause the epoxy resin as a thermosetting resin, to undergo cationic polymerization. The adhesive of the present invention cures at a lower temperature by taking advantage of the cationic polymerization.

17 Claims, 3 Drawing Sheets

ADHESIVE AND ELECTRIC DEVICE

BACKGROUND OF THE INVENTION

1. Field of the Invention

The present invention relates to adhesives, and more particularly, to adhesives for connecting semiconductor chips to a substrate.

2. Description of the Prior Art

Adhesives including a thermosetting resin, such as an epoxy resin, has traditionally been used for attaching semiconductor chips to a substrate.

In an electric device, generally denoted by reference numeral 101 in FIG. 7, a semiconductor chip 111 is adhered to a substrate 113 by an adhesive 112. A bump-like terminal 121, which is arranged on the semiconductor chip 111, is in contact with a terminal 122, which is a part of a wiring pattern on the substrate 113. In the state shown, an internal circuit within the semiconductor chip 111 is electrically connected to the wiring pattern on the substrate 113 via the terminals 121 and 122. A thermosetting resin in the adhesive 112 is cured to mechanically connect the semiconductor 111 to the substrate 113.

The adhesive 112 typically includes a curing agent such as a microcapsulated imidazole for curing the epoxy resin.

The adhesive using such a curing agent must be heated to a temperature of 180° C. or above to be cured. Such a high temperature condition may damage the wiring pattern on the substrate 113 when the wiring pattern is finely formed. A low heating temperature requires a prolonged heat treatment though the damage caused by heat may be reduced.

In recent years, adhesives including a radical polymerizable resin, such as an acrylate, and a radical polymerization initiator have been developed. While these adhesives are readily curable at a relatively low temperature, the electrical characteristics and heat-resistance they exhibit when cured are not as good as adhesives using thermosetting resins. For this reason, the electrical device 101 constructed using such adhesives tends to be less reliable.

BRIEF SUMMARY OF THE INVENTION

The present invention has been devised to overcome the above-described drawbacks of the prior art. The present intention is a novel adhesive that can be cured in short time under low temperature conditions and can ensure reliable connection.

During the course of the studies, which focused on techniques that, rather than using common curing agents, took advantage of cationic polymerization of epoxy resin, the present inventors made a discovery that an adhesive is cured in a short time at a low temperature when a silane compound (a silane coupling agent) having at least one alkoxy group in its structure and a metal chelate are added to the adhesive and cations generated in the reaction of the metal chelate with the silane coupling agent are utilized to cause the epoxy resin to polymerize(cationic polymerization).

The curing process of the epoxy resin that takes place in the adhesive including the metal chelate and the silane coupling agent is described below with reference to the following reaction formulae (1) to (4).

$$X-Si-OR + H_2O \rightarrow X-Si-OH + R-OH \quad \text{reaction formula (1)}$$

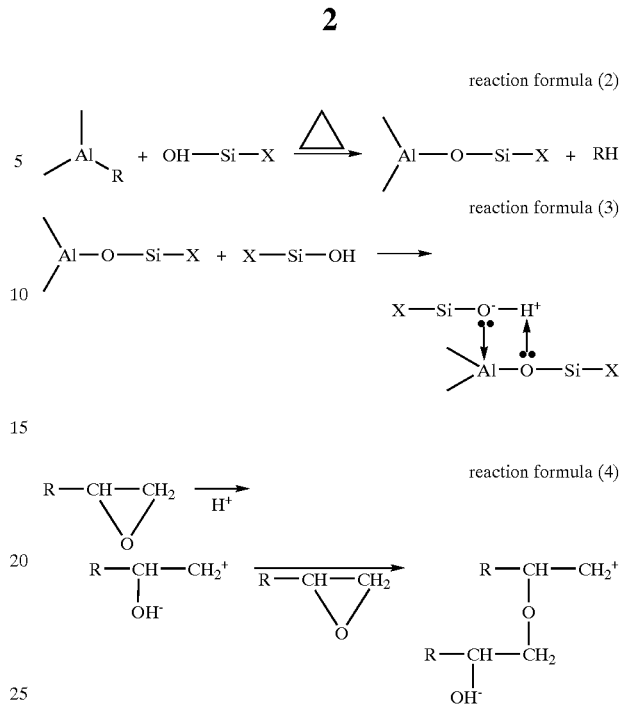

In reaction formula (1). RO represents an alkoxy group. As indicated by reaction formula (1), when the silane compound that has at least one alkoxy group reacts with water present in the adhesive, the silane compound is hydrolyzed at its alkoxy group to form a silanol group (Si—OH).

When the adhesive is heated, the silanol group reacts with the metal chelate, such as an aluminum chelate, and the silane compound binds to the aluminum chelate (reaction formula (2)).

As indicated by reaction formula (3), the other silanol groups that remain in the adhesive when the system is in equilibrium form coordinate bonds with the aluminum chelate to which the silanol group binds. As a result, Bronsted acid sites are formed and, as indicated by reaction formula (4), the activated proton acts to open a terminal epoxy ring of the epoxy resin. This allows the epoxy resin to bind to an epoxy ring of another epoxy resin molecule (cationic polymerization).

Thus, the adhesive, which is prepared using the silane coupling agent, the metal chelate and the thermosetting resin which is polymerized by the activated proton, is cured as the thermosetting resin undergoes cationic polymerization.

Since the above-described process can proceed at a temperature lower than that at which conventional adhesives are cured (180° C. or above), addition of the metal chelate and the silane compound to an adhesive makes it possible for the adhesive to cure in short time at a low temperature.

In view of the facts set forth above, the present invention provides in one aspect an adhesive including a resin component, a metal chelate, and a silane coupling agent, wherein the resin component includes a thermosetting resin and the silane coupling agent is composed of a silane compound represented by general formula (1):

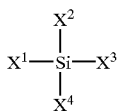

General formula (1)

wherein at least one of substituents $X^1$ through $X^4$ is an alkoxy group.

In a preferred embodiment, the alkoxy group is a methoxy group.

In a preferred embodiment, the alkoxy group is an ethoxy group.

In a preferred embodiment at least one of the substituents $X^1$ through $X^4$ of the silane compound is a substituent other than an alkoxy group, and at least one of the substituents other than an alkoxy group has an epoxy ring.

In another preferred embodiment, at least one of the substituents $X^1$ through $X^4$ of the silane compound is a substituent other than an alkoxy group and at least one of the substituents other than an alkoxy group has vinyl group.

In a preferred embodiment, the substituent having an epoxy ring is a γ-glycidoxypropyl group represented by chemical formula (2):

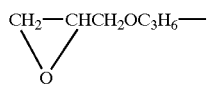

Chemical formula (2)

In a preferred embodiment, the substituent having a vinyl group is a γ-methacryloxypropyl group represented by chemical formula (3):

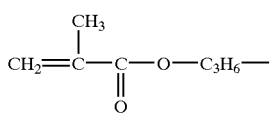

Chemical formula (3)

In a preferred embodiment, the amount of the metal chelate is from 0.1 parts by weight to 20 parts by weight with respect to 100 parts by weight of the resin component, and the amount of the silane coupling agent is from 0.1 parts by weight to 35 parts by weight with respect to 100 parts by weight of the resin component.

Preferably, the resin component also includes a thermoplastic resin and the amount of the thermoplastic resin is from 10 parts by weight or more with respect to 100 parts by weight of the thermosetting resin.

In a preferred embodiment, the thermosetting resin is an epoxy resin.

In a preferred embodiment, the epoxy resin is an alicyclic epoxy resin.

In a preferred embodiment, the metal chelate includes an aluminum chelate as a major constituent.

In another embodiment the present invention provides an adhesive film obtainable by forming an adhesive into a sheet, the adhesive including a resin component, a metal chelate, and a silane coupling agent, wherein the resin component includes a thermosetting resin and the silane coupling agent is composed of a silane compound represented by general formula (1):

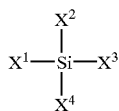

General formula (1)

wherein at least one of substituents $X^1$ through $X^4$ is an alkoxy group.

In a further embodiment, the present invention provides an electric device comprising a semiconductor chip and a substrate, wherein an adhesive is disposed between the semiconductor chip and the substrate and is cured by heating the adhesive, and includes a resin component, a metal chelate, and a silane coupling agent wherein the resin component includes a thermosetting resin and the silane coupling agent is composed of a silane compound represented by general formula (1):

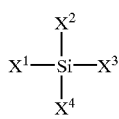

General formula (1)

wherein at least one of substituents $X^1$ through $X^4$ is an alkoxy group.

In a still further embodiment, the present invention provides an electric device comprising a glass substrate and a substrate, wherein an adhesive is disposed between the glass substrate and the substrate and is cured by heating the adhesive, including a resin component, a metal chelate, and a silane coupling agent, wherein the resin component includes a thermosetting resin, and the silane coupling agent is composed of a silane compound represented by general formula (1):

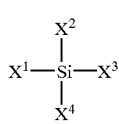

General formula (1)

wherein at least one of substituents $X^1$ through $X^4$ is an alkoxy group.

In the further embodiment, the present invention is an adhesive wherein the metal chelate is microcapsulated.

In a preferred embodiment, the metal chelate is a powder or liquid.

In a preferred embodiment, the microcapsules are formed as absorbent resin particles and dispersed in the adhesive.

At least one of the substituents $X^1$ through $X^4$ of the silane coupling agent is an alkoxy group in a preferred embodiment.

Cations produced in a reaction of the silane coupling agent with the metal chelate causes the thermosetting resin to polymerize. This makes it possible for the adhesive to cure in further short time at a lower temperature as compared to conventional adhesives.

While the alkoxy group of the silane coupling agent used in the present invention may include not only those in which an alkyl group is bound to an oxygen atom such as a methoxy group and an ethoxy group but also those including a ring structure and those including unsaturated bonds such as an olefin or acetylene. The alkoxy group in which an alkyl group is bound to an oxygen atom, especially a methoxy group, in which a methyl is bound to an oxygen atom, is preferred in terms of steric hindrance upon hydrolysis of the silane coupling agent.

When the substituents of the silane coupling agent other than alkoxy include a highly reactive functional group such as an epoxy ring, the strength of the cured adhesive is enhanced since the reactive functional group is involved in the polymerization of the thermosetting resin.

A silanol group has a tendency to be absorbed onto and bind to various inorganic materials as well as to metal chelates. When the adhesive of the present invention is used to attach objects, such as glass substrates made of an inorganic material, to one another, silanol groups of the silane coupling agent bind to the surface of the inorganic material while the substituents other than the silanol group bind to the resin component of the adhesive. Thus, the adhesive of the present invention shows a high affinity for inorganic materials since the silane coupling agent serves to bind the inorganic material to the resin component.

Though not involved in the curing of the resin component, the thermoplastic resin included as part of the resin component acts to enhance the adhesiveness of the adhesive. When the thermoplastic having a high polarity is used, it not only plays a role in the curing of the resin component but also binds to the inorganic material via the silane coupling agent, thus enhancing the readiness of the adhesive to cure and the adhesive's affinity for inorganic materials.

Also, the metal chelate, involved in the cationic polymerization, may be microcapsulated and used as a so-called "latent curing agent" to improve storage stability of the adhesive of the present invention.

While the silane coupling agent is hydrolyzed by moisture deposited on surfaces of the curing agent particles or present in the atmosphere, it may be converted into silanol by adding water before it is added to the adhesive. Alternatively, water may be added to the adhesive to promote conversion of the silane coupling agent into silanol. This further accelerates the process.

BRIEF DESCRIPTION OF THE DRAWINGS

These and other objectives and advantages of the present invention will become apparent from the following description with reference to the accompanying drawings.

DETAILED DESCRIPTION OF PREFERRED EMBODIMENTS

Preferred embodiments of the present invention will now be described.

First, a thermosetting resin is mixed with a thermoplastic resin dissolved in an organic solvent to form a resin component that comprises the thermosetting resin and the thermoplastic resin as major constituents. Subsequently, the resin component, a metal chelate, and a silane coupling agent are blended with each other to prepare an adhesive of the present invention. At this point, the adhesive takes the form of a paste.

Figure 1A:
FIGS. 1(a) to 1(d) each illustrate one example of bonding using an adhesive of the present invention.

In FIG. 1(a), a peelable film is denoted by a reference numeral 25. An adhesive coating layer 15 is formed on one surface of the peelable film 25 by coating with a predetermined amount of the adhesive of the present invention and drying the coating to remove the organic solvent from the adhesive. As a result, an adhesive film 20 composed of the peelable film 25 and the adhesive coating layer 15 is obtained. At this point, the adhesive coating layer 15 is no longer a paste but it now takes the form of a solid although the adhesive comprising the adhesive coating layer 15 has not been cured yet.

Figure 1B:
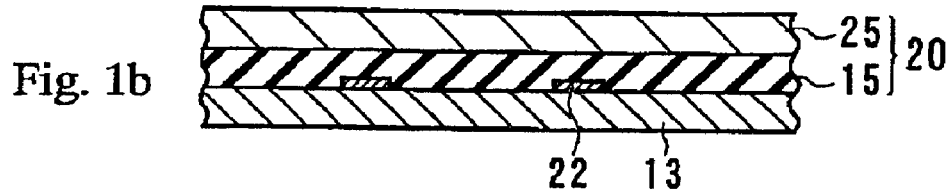

In FIG. 1(b), a reference numeral 13 denotes a substrate, and a metal wiring is arranged on one surface of the substrate 13 (not shown). A connection terminal 22 which is provided by a broad portion of the metal wiring, is exposed on the surface of the substrate 13.

Figure 1C:
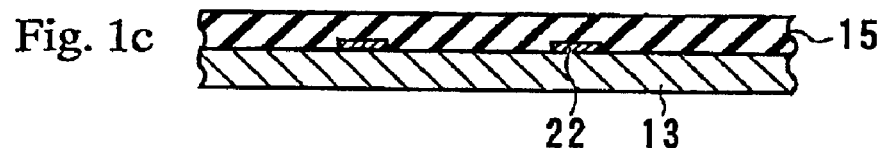

In FIG. 1(b), the adhesive coating layer 15 of the adhesive film 20 is tightly placed over the surface of the substrate 13 on which the connection terminal 22 is arranged. The adhesive film 20 and the substrate 13 are then pressed against each other to fix the adhesive film 20 to the substrate 13. When the peelable film 25 is peeled, the adhesive coating layer 15 remains on the surface of the substrate 13 while the peelable film 25 is removed from the coating layer 15 shown in FIG. 1(c), since the strength of adhesion between the peelable film 25 and the adhesive coating layer 15 is made smaller than that between the substrate 13 and the adhesive coating layer 15.

Figure 1D:
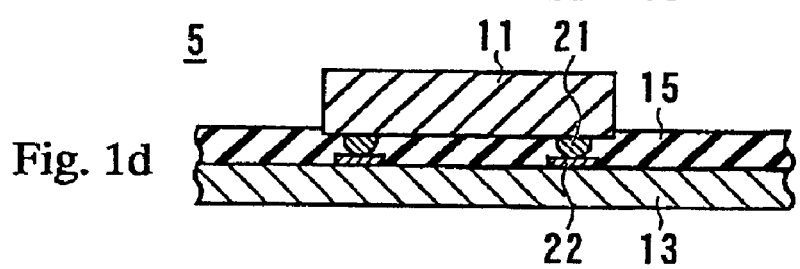

In FIG. 1(d), a semiconductor ship 11 has protruding bump-like connection terminals 21 arranged on the surface of the semiconductor device, and the connection terminals 21 are connected to an internal circuit (not shown) formed in the semiconductor chip 11.

In order to place the semiconductor chip 11 on the substrate 13, the substrate 13, on the surface of which is provided with the adhesive coating layer 15, is mounted on a mount table (not shown). The surface of the semiconductor chip 11 that has the connection terminals 21 disposed thereon is pressed against the surface of the adhesive coating layer 15 on the substrate 13. The adhesive coating layer 15 softens as the semiconductor chip 11 is heated while being pushed from above. The semiconductor chip 11, as it is being pushed from above pushes out some of the softened adhesive coating layer 15, and the connection terminals 21 of the semiconductor chip 11 come into contact with the surfaces of the connection terminals 22 of the substrate 13 (FIG. 1(d)).

Heating is continued for a predetermined time to harden the adhesive coating layer 15 while the connection terminals 21 and 22 contact with each other. As a result, an electric device 5 of the present invention is obtained in which the semiconductor chip 11 is fixed to the substrate 13 by means of the cured adhesive coating layer 15 with the connection terminals 21 of the semiconductor 11 electrically connected with the connection terminals 22 of the substrate 13.

While a particular manner of connecting the substrate 13 to the semiconductor chip 11 has thus far been described which takes advantage of the adhesive film 20 comprised of the peelable film 25 and the adhesive coating layer 15, the substrate 13 may be connected to the semiconductor chip 11 in other manners. For example, the adhesive film may be comprised solely of the adhesive coating layer 15 when the adhesive coating layer 15 is semi-cured to a degree that makes the coating layer sufficiently strong to support itself.

For one example of the technique for semi-curing the adhesive coating layer 15 to make it self-supporting, it is possible to heat the adhesive coating layer 15 in certain degree that the adhesive coating layer 15 is not completely cured. Alternatively, the adhesive film may be one that is obtained by adding a solid resin to the adhesive to increase its viscosity and forming the adhesive into film.

While particular cases in which the adhesive is formed into film have been described above, the adhesive may be used in other forms in the present invention. For example, the adhesive of the present invention may be used as a paste.

Figure 2A:
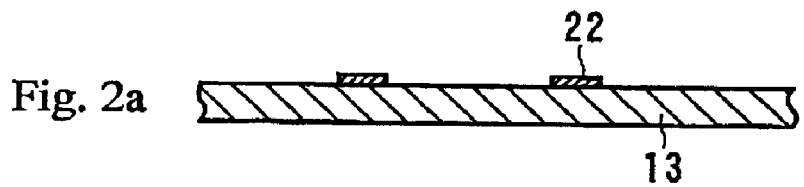
FIGS. 2(a) to 2(c) illustrate other uses of the adhesive of the present invention.
Figure 2B:
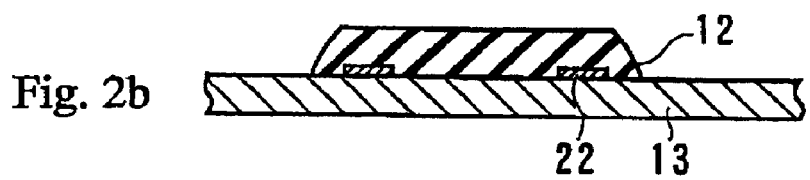
Figure 2C:
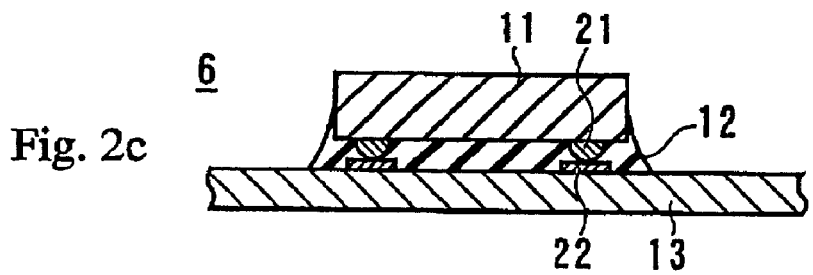

FIG. 2(a) shows a substrate identical to the one shown in FIG. 1(b). In order to mount a semiconductor chip 11 on a substrate 13, the adhesive in the form of a paste is first coated onto the surface of the substrate 13 having connection terminals 22 arranged thereon to form a coating layer 12 of the adhesive (FIG. 2(b)).

The substrate 13 is then positioned relative to the semiconductor chip 11 SO that the connection terminals 22 of the substrate 13 are facing connection terminals 21 of the semiconductor chip 11. The surface of the semiconductor chip 11 having the connection terminals 21 arranged thereon is then pressed against the surface of the adhesive coating layer 12 on the substrate 13. Since the adhesive coating layer 12 has a low viscosity, the semiconductor chip 11 pushes out some of the adhesive coating layer 12 and the connection terminals 21 of the semiconductor chip 11 come into contact with the surfaces of connection terminals 22 of the substrate 13.

When the substrate 13 and the semiconductor chip 11 are heat-pressed against each other through the same process as described with reference to FIG. 1(d), the adhesive in the adhesive coating layer 12 is cured while the connection terminals 22 of the substrate 13 tightly in contact with the connection terminals 21 of the semiconductor chip 11. This completes an electric device 6 of the present invention.

While some cases have been described in which the semiconductor chip 11 is connected to the substrate 13, the present invention may suitably be used for connecting various electric devices. For example, the present invention may be used for connecting a substrate, such as a tape carrier package (TCP). on which a semiconductor chip can be mounted, to a liquid crystal display (LCD).

Figure 3A:
FIGS. 3(a) to 3(d) illustrate one example of a process of connecting an LCD to a TCP using the adhesive of the present invention.

In FIG. 3(a), a reference numeral 60 denotes a glass substrate for use in an LCD. An indium tinoxide (ITO) electrode 65 is formed on one surface of the glass substrate 60.

Figure 3B:
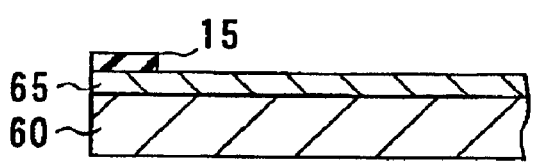

The adhesive film 20 having a same structure as shown in FIG. 1(a) is disposed on the surface of the ITO electrode 65 on the edge of the glass substrate 60. The peelable film 25 is peeled in the same manner as shown in FIG. 1(b), and then, the adhesive coating layer 15 comprising the adhesive, remains on the ITO electrode 65 as shown in FIG. 3(b).

Then, the glass substrate 60 is mounted on a mount table (not shown) with its surface having the ITO electrode 65 disposed thereon facing upward.

Figure 3C:
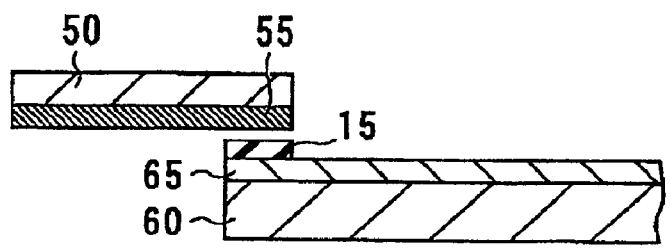

In FIG. 3(c), a reference numeral 50 denotes a TCP. In this case, a strip of TCP is cut out from a TCP stock sheet to serve as the TCP 50. The TCP comprises a resin film. A plurality of narrow metal wirings 55 are arranged on one surface of the TCP 50 along the longitudinal direction of the TCP 50. Ends of the metal wirings 55 coincide with ends of the TCP when viewed in the longitudinal direction.

When the TCP 50 is positioned relative to the glass substrate 60 so that the surface of the TCP 50 having the metal wirings 55 arranged thereon faces downward and the ends of the metal wirings 55 of the TCP 50 is located above the edge of the glass substrate 60 on which the adhesive coating layer 15 is disposed. The ends of the metal wirings 55 face the adhesive coating layer 15 (FIG. 3(c)).

Figure 4:
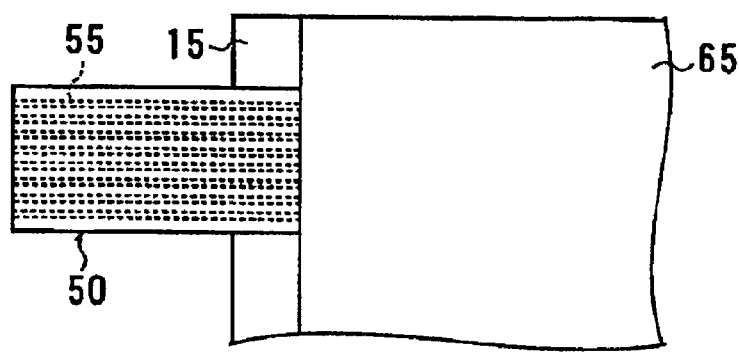
FIG. 4 is a plan view illustrating the manner in which the TCP and glass substrate are overlapped with each other.

The ends of the metal wirings 55 of the TCP 50 are then pressed against the surface of the adhesive coating layer 15. This arrangement is shown in a plan view in FIG. 4. When the TCP 50 and the glass substrate 60 are heated while the end of the TCP 50 overlapping the glass substrate 60 are being pressed, the adhesive coating layer 15 softens. Pressed from above, the ends of the TCP 50 pushes out the softened adhesive coating layer 15 and brings the ends of the metal wirings 55 of the TCP 50 into contact with the surface of the ITO electrode 65 on the glass substrate 60.

Figure 3D:
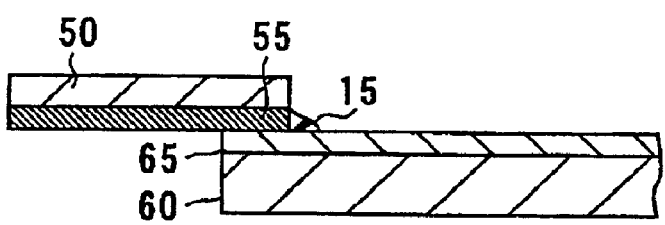

FIG. 3(d) shows this arrangement after heating is completed. The adhesive coating layer 15 is cured with the ends of the metal wirings 55 of the TCP 50 held in contact with the ITO electrode 65. In this state, not only is the TCP 50 mechanically connected to the glass substrate 60, but the metal wirings 55 of the TCP 50 are electrically connected to the ITO electrode 65.

Specific examples of the silane coupling agents that can be used in the present invention are listed in Table 1 below.

TABLE 1

Examples of silane coupling agents for use in the present invention

| | Name of Compound | Structural Formula | Product name |
|---|---|---|---|
| 1 | vinyltris(β-methoxy-ethoxy)silane | $CH_2=CHSi(OC_2H_4OCH_3)_3$ | KBC1003 |
| 2 | vinyltriethoxysilane | $CH_2=CHSi(OC_2H_5)_3$ | KBE1003 |
| 3 | vinyltrimethoxysilane | $CH_2=CHSi(OCH_3)_3$ | KBM1003 |
| 4 | γ-methacryloxypropyl trimethoxysilane | $CH_2=C(CH_3)-C(=O)-O-C_3H_6Si(OCH_3)_3$ | KBM503 |

TABLE 1-continued

Examples of silane coupling agents for use in the present invention

| | Name of Compound | Structural Formula | Product name |
|---|---|---|---|
| 5 | β-(3,4-epoxycyclohexyl)ethyl-trimethoxysilane | (epoxycyclohexyl)–$C_2H_4Si(OCH_3)_3$ | KBM303 |
| 6 | γ-glycidoxypropyl trimethoxysilane | $CH_2\text{—}CHCH_2OC_3H_6Si(OCH_3)_3$ (epoxide) | KBM403 |
| 7 | γ-glycidoxypropyl methyldiethoxysilane | $CH_2\text{—}CHCH_2OC_3H_6Si(CH_3)(OC_2H_5)_2$ (epoxide) | KBM402 |
| 8 | N-β(aminoethyl) γ-aminopropyl trimethoxysilane | $H_2NC_2H_4NHC_3H_6Si(OCH_3)_3$ | KBM603 |
| 9 | N-β(aminoethyl) γ-aminopropylmethyl dimethoxysilane | $H_2NC_2H_4NHC_3H_6Si(CH_3)(OCH_3)_2$ | KBM602 |
| 10 | γ-aminopropyl triethoxysilane | $H_2NC_3H_6Si(OC_2H_5)_3$ | KBM903 |
| 11 | N-phenyl-γ-aminopropyl trimethoxysilane | $C_6H_5NHC_3H_6Si(OCH_3)_3$ | KBM573 |
| 12 | γ-mercaptopropyl trimethoxysilane | $SHC_3H_6Si(OCH_3)_3$ | KBM803 |
| 13 | γ-chloropropyl trimethoxysilane | $ClC_3H_6Si(OCH_3)_3$ | KBM703 |
| 14 | γ-glycidoxypropyl trimethoxysilane | $CH_2\text{—}CHCH_2OC_3H_6Si(OC_2H_5)_3$ (epoxide) | KBE403 |

*Each silane coupling agent shown in Table 1 above is manufactured by SHINETSU CHEMICAL Co., Ltd.

As shown in Table 1 above, the silane compounds for use as the silane coupling agent include from 1 to 3 alkoxy groups, such as ethoxy and methoxy, in one molecule of the silane compound. The substituents other than alkoxy groups include in its structure functional groups such as an epoxy ring, a vinyl group, an amino group, or a mercapto group. Such substituents not only exhibit a high affinity for organic compounds including resins, they may also be involved in a curing reaction of the thermosetting resin.

In cases of the substituents, such as a γ-glycidoxypropyl group or a β-(3,4-epoxycyclohexyl) ethyl group, that include an epoxy ring at their terminal end, the epoxy ring is involved in the polymerization of the epoxy resin. Thus, the strength that the adhesive can achieve after being cured by heating can be enhanced by using the silane coupling agents having a terminal epoxy group as represented by the compounds No. 5, 6. 7 and 14 listed in Table 1 above.

While the silane coupling agents having 3 or fewer alkoxy groups in one molecule of that agent have been described above, use of other types of silane coupling agents is also contemplated. For example, the silane coupling agent may be a silane compound whose substituents are composed exclusively of alkoxy groups (i.e., silicate).

Also, a substance, such as silica, that has a silanol group may be used in place of the silane coupling agent. It should be noted, however, that silica generally exists as particles whereas the silane coupling agents exist as a liquid and, therefore, the silane coupling agents are more advantageous than silica in that they are better dispersed in the adhesive and have a higher reactivity than does silica.

While various metal chelates such as zirconium chelate, titanium chelate, and aluminum chelate may be used in the present invention, aluminum chelate is particularly preferred due to its high reactivity. Also, the metal chelates may be provided in various forms such as powder and liquid.

Examples of the thermosetting resin that can be used in the present invention include various resins such as epoxy resins, urea resins, melamine resins, and phenol resins. The epoxy resins are particularly preferred in terms of the strength that the adhesive can achieve after it is cured by heating.

The adhesiveness of the adhesive can be enhanced by blending a thermoplastic resin in the resin component since thermoplastic resins have a property to enhance a cohesion of the adhesive. Examples of such thermoplastic resin include various resins such as phenoxy resins, polyester resins, polyurethane resins, poly(vinyl acetal), ethylene vinyl acetate, and rubbers such as polybutadiene rubber.

EXAMPLES

Adhesives of Examples 1 through 10 and Comparative Example 1 were prepared by making resin components a metal chelate, a silane coupling agent and electroconductive particles in proportions as shown in the following Table 2 in the columns indicated as "compositions of adhesives." The adhesives prepared were used to fabricate adhesive films of Examples 1 through 10 and Comparative Example 1, each of which had the same structure as the adhesive film denoted by the reference numeral 20 in FIG. 1(*a*).

TABLE 2

Compositions of Adhesives and Tests for the Peeling Strength

| | | | Examples | | | | | | | | | | | Comparative Example |
|---|---|---|---|---|---|---|---|---|---|---|---|---|---|---|
| | | | 1 | 2 | 3 | 4 | 5 | 6 | 7 | 8 | 9 | 10 | 1 |
| Compositions of Adhesives | Thermoplastic Resin | YP50 | 50 | 50 | 50 | 50 | 50 | 50 | 50 | 50 | 50 | — | 50 |
| | Thermosetting Resin | EPICOAT 828 | 50 | 25 | — | — | — | — | — | — | — | — | 20 |
| | | CEROXIDE 2021P | — | 25 | 50 | 50 | 50 | 50 | 50 | 50 | 50 | 100 | — |
| | Curing Agent | HX3941HP | — | — | — | — | — | — | — | — | — | — | 30 |
| | Metal Chelate | TAA | — | — | — | — | — | — | 2 | — | — | — | — |
| | | Alumichelate A (W) | 2 | 2 | 2 | 2 | 2 | 2 | — | 2 | 2 | 2 | — |
| | Silane Coupling Agent | KBE-402 | — | — | 3 | — | — | — | — | — | — | — | — |
| | | KBE-403 | — | — | — | 3 | — | — | — | — | — | — | — |
| | | KBM-403 | 3 | 3 | — | — | 3 | — | 3 | 15 | 0.5 | 3 | 3 |
| | | KBM-503 | — | — | — | — | — | 3 | — | — | — | — | — |
| | Electroconductive Particle | | 5 | 5 | 5 | 5 | 5 | 5 | 5 | 5 | 5 | 5 | 5 |
| Results | Peeling Strength (N/cm) | | 4.5 | 8.3 | 11.1 | 15.3 | 17.1 | 13.5 | 12.1 | 19.0 | 14.4 | 2.2 | 1.3 |
| | Evaluation | | Δ | Δ | ○ | ◎ | ◎ | ○ | ○ | ◎ | ○ | × | × |

\* The numbers assigned to each composition shown in Table 2 above indicate the amounts of components in parts by weight.
YP50: phenoxy resin (manufactured by TOHTO KASEI Co., Ltd.), EPICOAT 828: biaphenol A-type epoxy resin (manufactured by YUKA SHELL EPOXY Co., Ltd.), CEROXIDE 2021P: alicyclic epoxy resin (manufactured by DAICEL CHEMICAL INDUSTRIES Ltd.), HX3941HP: masterbatch-type, microcapsulated imidazole manufactured by ASAHI DENKA Kogyo K.K.), TAA: titanium acetylacetonate (manufactured by MITSUBISHI GAS CHEMICAL Co., Ltd.), ALUMICHELATE A (W): aluminum acetylacetonate (manufactured by Kawaken Fine Chemicals Co., Ltd.), KBE-402: γ-glycidoxypropylmethyldiethoxysilane (manufactured by Shin-Etsu Chemical Co., Ltd.), KBE-403: γ-glyoldoxypropyltriethoxysilane (manufactured by Shin-Etsu Chemical Co., Ltd.), KBM-403: γ-glyoldoxypropyltrimethoxysilane (manufactured by Shin-Etsu Chemical Co., Ltd.), KBM-503: γ-methacryloxypropyltrimethoxysilane (manufactured by Shin-Etsu Chemical Co., Ltd.)

A phenoxy resin, manufactured by TOHTO KASEI Co., Ltd., under the product name YP50, was used as a thermoplastic resin. A bisphenol A-type epoxy resin, manufactured by YUKA SHELL EPOXY Co., Ltd., under the product name EPICOAT 828 and an alicyclic epoxy resin, manufactured by DAICEL CHEMICAL INDUSTRIES Co., Ltd., under the product name CEROXIDE 2021P were used as thermosetting resins. A masterbatch-type, microcapsulated imidazole, manufactured by ASAHI DENKA Co., Ltd., under the product name HX3941HP was used as a potential curing agent in Comparative Example 1. A titanium acetylacetonate, manufactured by MITSUBISHI GAS CHEMICAL Company Inc., under the product name TAA and an aluminum acetylacetonate, manufactured by KAWAKEN FINE CHEMICALS Co., Ltd., under the product name ALUMICHELATE A (W), were used as metal chelates. A γ-glycidoxypropylmethyldiethoxysilane, manufactured by SHINETSU CHEMICAL Co., Ltd., under the trade name KBE-402, a γ-glycidoxypropyltriethoxysilane, manufactured by SHINETSU CHEMICAL Co., Ltd., under the trade name KBE-403, a γ-glycidoxypropyltrimethoxysilane, manufactured by SHINETSU CHEMICAL Co., Ltd., under the trade name KBM-403, and a γ-methacryloxypropyltrimethoxysilane, manufactured by SHINETSU CHEMICAL Co., Ltd., under the trade name KBM-503 were used as silane coupling agents.

Each of the adhesives of Examples 1 through 10 includes a metal chelate and a silane coupling agent. The adhesive of Example 10 does not include a thermoplastic resin(and this is a less preferred embodiment of the invention). The adhesive of Comparative Example 1 does not include a metal chelate, but it includes a silane coupling agent and an imidazole curing agent.

Using the glass substrates 60, on one surface of which had been formed the ITO electrode 65 with a sheet resistance of 10Ω per 1 cm$^2$ of the surface area, and strips of the TCP 50 with a width of 1 cm (for this purpose, strips in which several metal wirings 55, each having a width of 25 μm and formed as a tin-plated copper wire were equally spaced apart from one another at an interval of 25 μm were used), eleven different types of sample pieces were obtained by adhering the strips of the TCP 50 to the glass substrates 60 in the manner described with reference to FIGS. 3(a) through 3(d) using the adhesives of Examples 1 through 10 and Comparative Example 1. The width of the overlap (press-adhered width) between each strip of the TCP 50 and each of the glass substrates 60 was 1 mm. The strips of TCP 50 were adhered to the glass substrates 60 by applying a load of 3 MPa while they were heated to 130° C. for 10 seconds.

These sample pieces were measured for the peeling strength, which was defined as the magnitude of the force required to cause the TCP 50 to be removed from the glass substrate 60 when the TCP 50 was pulled in a direction perpendicular to the surface of the glass substrate 60. The sample pieces were rated on a scale of cross (X), triangle (Δ), circle (○) and double circle (◎) in terms of the peeling strength, where the cross (X) indicates the peeling strength lower than 3N/cm, the triangle (Δ) indicates the peeling strength of 3N/cm or higher and lower than 10N/cm, the circle (○) indicates the peeling strength of 10N/am or higher and lower than 15N/cm, and the double circle (◎) indicates the peeling strength of 15N/cm or higher. The measurements of the peeling strength and evaluation are shown in the column "Results" of Table 2 above, along with the ratings.

As can be seen from the results shown in Table 2 above, the sample pieces using the adhesives of Examples 1 through 10, each of which included a metal chelate and a silane coupling agent, have peeling strengths higher than that of the adhesive of Comparative Example 1, which included a conventional curing agent. Consequently, the adhesives of the present invention have proven to exhibit strong adhesiveness even adopting heat-pressing conditions of a lower temperature as low as 130° C. and a shorter period of time as short as 10 seconds. When the adhesive of Example 10 was used, the adhesive, though cured, became hard and brittle after being cured and the peeling strength of the sample piece was low.

Comparison of Example 1, each including the same metal chelate and the same silane coupling agent, showed that the adhesive of Example 2, which included the alicyclic epoxy res in (CEROXIDE 2021P) as a thermosetting resin, had a higher peeling strength than the adhesive of Example 1. These results suggest that the alicyclic epoxy resin (CEROXIDE 2021P) used in Example 2 can undergo cationic polymerization at a much faster rate as compared to the bisphenol A-type epoxy resin (EPICOAT 828) used in Example 1.

Comparison of Examples 5 and 7, each including the same resin components and the same silane coupling agent, showed that the adhesive of Example 5, which included the highly reactive aluminum chelate as a metal chelate, had a higher peeling strength than the adhesive of Example 7, which included the titanium chelate.

Also, the adhesive of Example 5, which used the γ-glycidoxypropyltriimethoxysilane as a coupling agent, had a higher peeling strength than did the adhesive of Example 6, which used the γ-methacryloxypropyltrimethoxysilane. The substituent other than the methoxy group was a methacryloxypropyl group having a vinyl group in the silane coupling agent used in the adhesive of Example 6, whereas the substituent other than the methoxy group was a glycidoxypropyl group having an epoxy ring in the silane coupling agent used in the adhesive of Example 5. It is believed that this epoxy ring was involved in the polymerization with the thermosetting resin, thereby increasing the peeling strength.

Among the adhesives of Examples 3 to 5, which included the silane coupling agents including the same glycidoxypropyl group but different numbers of alkoxy groups with different numbers of carbon atoms, the adhesive of Example 5, which included the coupling agent including the largest number of alkoxy groups having the fewer carbon atoms, showed the best results whereas the adhesive of Example 3, which included the coupling agent including fewer alkoxy groups than the other two coupling agents with the alkoxy groups having the larger number of carbon atoms, showed the worst results. This is because the silane coupling agent which includes alkoxy groups with fewer carbon atoms poses less steric hindrance when hydrolyzed, and the silane coupling agent with a larger number of alkoxy groups can provide more silanol groups in the cationic polymerization.

Among the adhesives of Examples 5, 8 and 9, which used the same resin components, metal chelate and silane coupling agent with the amount of the silane coupling agent being varied among the adhesives, the adhesive of Example 8, which included a larger amount of the silane coupling agent with respect to the amount of the metal chelate, showed a higher peeling strength than the adhesives of Examples 5 and 9, which included the silane coupling agent in smaller amounts.

The electroconductive particles for use in the adhesive of the present invention may be resin particles coated with metal or may be metal particles. Use of adhesives that do not include any electroconductive particles is also contemplated in the present invention. The adhesive of the present invention may further include various additives including a filler, a colorant, and an anti-aging agent.

While some cases have been described in which a powdered or liquid metal chelate is directly added to the adhesive, the metal chelate may be added to the adhesive of the present invention in other forms. For example, a microcapsulated metal chelate may be added to the adhesive.

Figure 5:
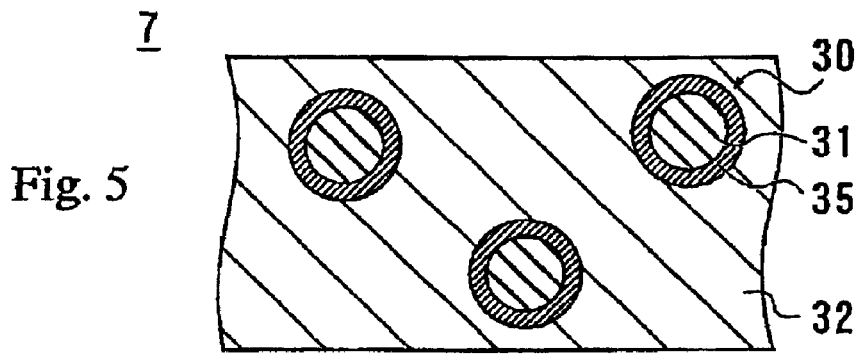
FIG. 5 is a schematic view of one example of the adhesive of the present invention in which powdered metal chelate is microcapsulated.

In FIG. 5, a reference numeral 7 denotes an adhesive, which includes an adhesive component 32 comprising resin component and microcapsules 30 dispersed in the adhesive component 32. The microcapsule 30 includes a particle 31 made of a metal chelate and a resin coating 35 formed over the surface of the particle 31.

The resin of the resin coating 35 has a glass transition temperature that is lower than the heat temperature to cure the adhesive. Thus, as the adhesive 7 is heated, the resin coating 35 melts and the metal chelate particle 31 is mixed with the adhesive component 32 to initiate the curing of the adhesive.

While a case has been described in which metal chelate powder is microcapsulated, other forms of metal chelate may also be used in the present invention. For example, liquid metal chelate may be microcapsulated and used in the adhesive. One example of such adhesive is denoted by a reference numeral 8 in FIG. 6. Microcapsules 40, formed as absorbent resin particles, are dispersed in adhesive component 42 of the adhesive 8. A liquid metal chelate is absorbed by and retained in the microcapsule 40. As the adhesive 8 is heated, the absorbing resin of the microcapsule 40 melts and the metal chelate is mixed with the adhesive component to initiate the curing of the adhesive.

Figure 6:
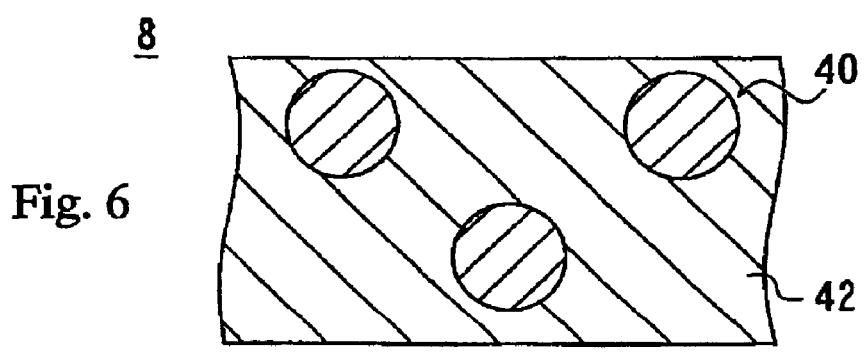
FIG. 6 is a schematic view showing one example of the adhesive of the present invention in which liquid metal chelate is microcapsulated.
Figure 7:
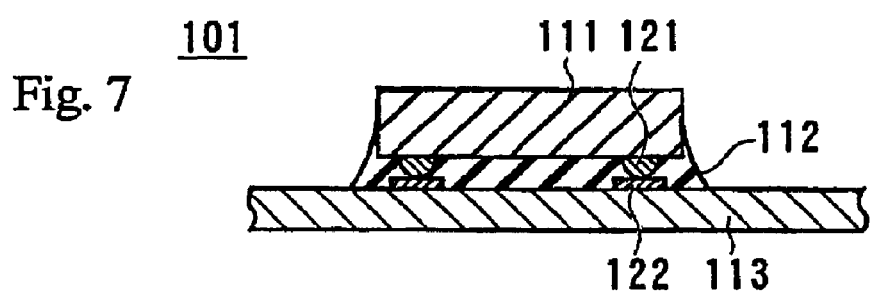
FIG. 7 is a schematic view illustrating a conventional adhesive.

Also, a liquid silane coupling agent may be microcapsulated in the same manner as in the microcapsule 40 shown in FIG. 6.

With the use of the adhesive of the present invention, which cures quickly at a lower temperature, thermal stress that is applied to semiconductor chips and substrate is minimized and reliable electric devices can be achieved.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. An adhesive comprising a resin component, a metal chelate, and a silane coupling agent, wherein said resin component includes a thermosetting resin and said silane coupling agent is composed of a silane compound represented by general formula (1):

General formula (1)

wherein at least one of substituents $X^1$ through $X^4$ is an alkoxy group, and wherein if one or more of the substituents $X^1$ through $X^4$ is a substituent other than alkoxy group, such substituent other than alkoxy group is a substituent that includes in its structure a functional group selected from the group consisting of epoxy ring, vinyl group, amino group, mercapto group and methyl group, wherein the metal chelate is microcapsulated,
wherein the adhesive is in the form of a paste,
wherein microcapsules are formed as absorbent resin particles and dispersed in the adhesive, and
wherein the metal chelate is liquid, and the metal chelate is absorbed by and retained in the microcapsules.

2. An adhesive film obtained by forming an adhesive composition into a film,
the adhesive composition comprising a resin component, a metal chelate, and a silane coupling agent,
wherein said resin component includes a thermosetting resin, and said silane coupling agent is composed of a silane compound represented by general formula (1):

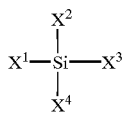

General formula (1)

wherein at least one of substituents $X^1$ through $X^4$ is an alkoxy group, and wherein if one or more of the substituents $X^1$ through $X^4$ is a substituent other than alkoxy group, such substituent other than alkoxy group is a substituent that includes in its structure a functional group selected from the group consisting of epoxy ring, vinyl group, amino group, mercapto group and methyl group, and
wherein the metal chelate is microcapsulated so as to be a microcapsule, and the microcapsule is dispersed in the adhesive film,
wherein microcapsules are formed as absorbent particles and dispersed in the adhesive film, and
wherein the metal chelate is liquid, and the metal chelate is absorbed by and retained in the microcapsules.

3. An adhesive comprising a resin component, a metal chelate, and a silane coupling agent,
wherein said resin component comprises a thermosetting resin and said silane coupling agent comprises a silane compound represented by general formula (1):

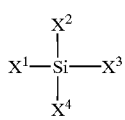

General formula (1)

wherein at least one of substituents $X^1$ through $X^4$ is an alkoxy group, and wherein if one or more of the substituents $X^1$ through $X^4$ is a substituent other than alkoxy group, such substituent other than alkoxy group is a substituent that includes in its structure a functional group selected from a group consisting of epoxy ring, vinyl group, amino group, mercapto group and methyl group, and
wherein the silane coupling agent is microcapsulated.

4. The adhesive according to claim 3, wherein said alkoxy group is a methoxy group.

5. The adhesive according to claim 3, wherein said alkoxy group is an ethoxy group.

6. The adhesive according to claim 3, wherein at least one of the substituents $X^1$ through $X^4$ of said silane compound is a substituent other than alkoxy and at least one of said substituents other than alkoxy has an epoxy ring.

7. The adhesive according to claim 6, wherein said substituent having the epoxy ring is a γ-glycidoxypropyl group represented by chemical formula (2):

Chemical formula (2)

8. The adhesive according to claim 3, wherein at least one of the substituents $X^1$ through $X^4$ of said silane compound is a substituent other than alkoxy and at least one of said substituents other than alkoxy has a vinyl group.

9. The adhesive according to claim 8, wherein said substituent having the vinyl group is a γ-methacryloxypropyl group represented by chemical formula (3):

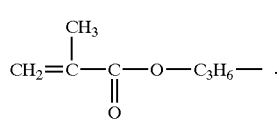

Chemical formula (3)

10. The adhesive according to claim 3, wherein an amount of said metal chelate is from 0.1 parts by weight to 20 parts by weight with respect to 100 parts by weight of said resin component and an amount of said silane coupling agent is from 0.1 parts by weight to 35 parts by weight with respect to 100 parts by weight of said resin component.

11. The adhesive according to claim 10, wherein said resin component includes a thermoplastic resin and an amount of said thermoplastic resin is 10 parts by weight or more with respect to 100 parts by weight of said thermosetting resin.

12. The adhesive according to claim 10, wherein said metal chelate includes an aluminum chelate as a major constituent.

13. The adhesive according to claim 3, wherein said resin component includes a thermoplastic resin and an amount of said thermoplastic resin is 10 parts by weight or more with respect to 100 parts by weight of said thermosetting resin.

14. The adhesive according to claim 3, wherein said thermosetting resin is an epoxy resin.

15. The adhesive according to claim 14, wherein the epoxy resin is an alicyclic epoxy resin.

16. The adhesive according to claim 3, wherein said metal chelate includes an aluminum chelate as a major constituent.

17. The adhesive according to claim 3, wherein the metal chelate is a powder or liquid.

* * * * *